(12) United States Patent
Yuan

(10) Patent No.: US 9,476,918 B2
(45) Date of Patent: Oct. 25, 2016

(54) ALTERNATING CURRENT DETECTOR WITH AUTOMATICALLY JUDGING OF THE AMOUNT OF ELEMENT UNDER TESTING AND MONITORING

(71) Applicant: CONNECTED AUTOMATION GLOBAL INC., New Taipei (TW)

(72) Inventor: Gary Yuan, New Taipei (TW)

(73) Assignee: CONNECTED AUTOMATION GLOBAL INC., New Taipei (TW)

( * ) Notice: Subject to any disclaimer, the term of this patent is extended or adjusted under 35 U.S.C. 154(b) by 88 days.

(21) Appl. No.: 14/590,562

(22) Filed: Jan. 6, 2015

(65) Prior Publication Data

US 2016/0025780 A1    Jan. 28, 2016

(30) Foreign Application Priority Data

Jul. 28, 2014    (TW) .............................. 103125628 A

(51) Int. Cl.
*G01R 19/00* (2006.01)
*G09G 1/00* (2006.01)
*H01L 21/00* (2006.01)

(52) U.S. Cl.
CPC ............. *G01R 19/0092* (2013.01); *G09G 1/00* (2013.01); *H01L 21/00* (2013.01); *H01L 2221/00* (2013.01)

(58) Field of Classification Search
CPC .... H01L 21/00; H01L 2221/00; H02M 1/00; H04L 1/00; H04L 2201/00; G09G 1/00; G09G 2230/00
See application file for complete search history.

(56) References Cited

U.S. PATENT DOCUMENTS

| 4,396,869 A * | 8/1983 | Rosenbaum ........ H02M 5/2576 315/194 |
| 5,450,305 A * | 9/1995 | Boys .......................... G05F 1/13 219/624 |
| 2014/0035541 A1* | 2/2014 | Jin ............................ G05F 1/70 323/210 |

FOREIGN PATENT DOCUMENTS

TW           M450732 U1     4/2013

* cited by examiner

*Primary Examiner* — Jermele M Hollington
*Assistant Examiner* — Temilade Rhodes-Vivour
(74) *Attorney, Agent, or Firm* — Locke Lord LLP; Tim Tingkang Xia, Esq.

(57) ABSTRACT

An alternating current detector with automatic judging of the amount of element under testing and monitoring, comprising a detecting input unit, a first output level unit, a second delay unit, a second output level unit and a cascade next element unit. The detecting input unit comprises a first delay unit and a first inverter. The first delay unit receives and delays an input signal. The input terminal of the first inverter is connected to the first delay unit and inverts the input signal. The first output level unit comprises a first NAND gate, a first diode and first resistor. The input terminal of the first NAND gate is connected to the alternating current signal of an element, another input terminal of the first NAND gate is connected to the output terminal of the first inverter.

12 Claims, 6 Drawing Sheets

ALTERNATING CURRENT DETECTOR WITH AUTOMATICALLY JUDGING OF THE AMOUNT OF ELEMENT UNDER TESTING AND MONITORING

CROSS-REFERENCE TO RELATED APPLICATION

This application claims priority of application No. 103125628, filed on Jul. 28, 2014 in the Taiwan Intellectual Property Office, the entire contents of which are hereby incorporated by reference.

FIELD OF THE INVENTION

The invention relates to an alternating current detector, and more particularly to an alternating current detector with cascading method, where one element that has been measured informs the next element, without fundamental error and accumulative error of the element, and automatically judging the amount of element under testing and monitoring.

BACKGROUND OF THE INVENTION

Alternating current (AC) is a current which periodically changes amperage and reverses direction, the average amperage of which is zero in a period. Compared with direct current (DC) of which direction does not reverse periodically, alternating current transmits electrical power more efficiently. Consequently, alternating current is the form in which electrical power is delivered to businesses and residences.

Because the electrical power of most electric appliances is supplied by alternating current, if the alternating current cannot be supplied of sufficient quality, most electric appliances cannot work normally and may be damaged. Consequently, how to detect whether the alternating current supplies electrical power normally is a solution to solve the problem.

With reference to Taiwan Pat. No. M450732 which discloses a block diagram of a voltage detector. The voltage detector receives a waveform signal from an external alternating current source and compares an amplitude of the waveform signal of the external alternating current source with an amplitude of the waveform signal of a standby alternating current source. At the same time of the external alternating current source and the standby alternating current source, if the amplitude of the waveform signal of the external alternating current source is less than the amplitude of the waveform signal of the standby alternating current source, the voltage of the external alternating current source is lower and less than the rated voltage value of the standby alternating current source. When this occurs a control unit switches a machine from being connected to the external alternating current source to being connected to the standby alternating current source. Consequently, the machine avoids shutdown due to a sudden drop in the voltage of the external alternating current source.

However, the alternate current detector is coupled to the alternating current itself. In the prior art, the voltage detector must be coupled to the external alternating current source to detect and compare the voltage of the external alternating current source in order to detect if the voltage drops. Consequently, the electrical characteristics of the detected electric appliances could influence and interfere. If the alternate current detector detects multiple electric appliances, each electric appliance needs to couple to an alternate current detector.

Even though these disadvantages of the prior art are known, there have been no acceptable and easy solutions to solve the problem.

SUMMARY OF THE INVENTION

One objective of the invention is to provide an alternating current detector where there is no need to couple to the alternating current itself, is not influenced and interfered by the electrical characteristics of the detected electric appliances, and can detect multiple electric appliances.

In order to accomplish the aforementioned objective and more, the present invention provides an alternating current detector with automatic judging the amount of element under testing and monitoring. The alternating current detector comprises a detecting input unit, a first output level unit, a second delay unit, a second output level unit and a cascade next element unit.

The detecting input unit comprises a first delay and a first inverter. The first delay unit has an output terminal, and receives and delays an input signal. The first inverter has an input terminal and an output terminal. The input terminal is connected to the first delay unit, which inverts the input signal.

The first output level unit comprises a first NAND gate, a first diode and a first resistor. The first NAND gate has a first input terminal, a second input terminal and an output terminal. The first input terminal is connected to an alternating current source of an element. The second input terminal is connected to an output of the first inverter.

The first diode has a positive terminal and a negative terminal. The negative terminal is connected to the output terminal of the first NAND gate. The first resistor has a first terminal and a second terminal. The first terminal is connected to the positive terminal of the first diode.

The second delay unit has an output terminal and is connected to the output terminal of the first inverter, which delays the input signal being inverted.

The second output level unit comprises a second NAND gate and a second diode. The second NAND gate has a first input terminal, a second input terminal and an output terminal. The first input terminal is connected to the output terminal of the first delay unit. The second input terminal is connected to the output terminal of the second delay unit. The second diode has a positive terminal and a negative terminal. The positive terminal is connected to the second terminal of the first resistor. The negative terminal is connected to the output terminal of the second NAND gate.

The cascade next element unit comprises a second inverter and a second resistor. The second inverter has an input terminal and an output terminal. The input terminal is connected to the output terminal of the second delay unit. The second resistor has a first terminal and a second terminal. The first terminal is connected to the output terminal of the second inverter. The second terminal is cascaded to an input terminal of a next element.

The alternating current detector with automatic judging of the amount of the element under testing and monitoring of the present invention directly detects the magnetic field which is generated by the alternating current in a noninvasive manner, which is not influenced and interfered by the electrical characteristics of the detected electric appliances. Moreover, the present invention transforms a weak alternating current signal into a digital ON/OFF electronic signal, which is used in long distance detection, is not interfered with and is durable.

The present invention automatically judges the amount of element under testing and monitoring, which uses a cascading method and measures one element and then informs the next element without fundamental error and accumulative error of the element.

The present invention identifies the element under testing and monitoring according to the cascading position, which is used directly without setting any parameters. The present invention uses output terminal parallel connections which dramatically reduces wiring.

DETAILED DESCRIPTION OF THE INVENTION

In order to describe details of the preferred embodiments of the present invention, description of the structure, and the application as well as the steps are made with reference to the accompanying drawings. It is learned that after the description, any variation, modification or the like to the structure and the steps of the embodiments of the preferred embodiments of the present invention are easily made available to any person skilled in the art. Thus, the following description is only for illustrative purpose only and does not, in any way, try to limit the scope of the present invention.

Figure 1:
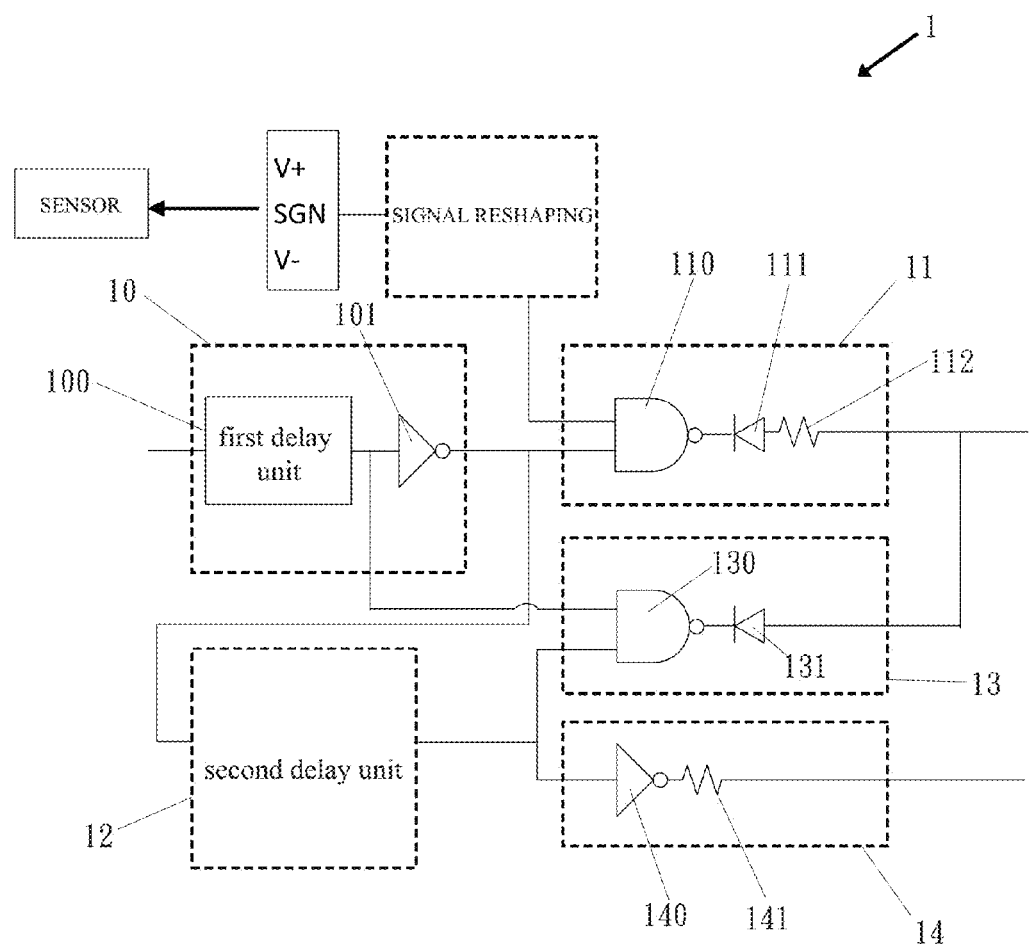
FIG. 1 is a system diagram showing the alternating current detector with automatic judging of the amount of element under testing and monitoring of the present invention.

With reference to FIG. 1, the present invention provides an alternating current detector with automatic judging of the amount of element under testing and monitoring 1. The alternating current detector 1 comprises a detecting input unit 10, a first output level unit 11, a second delay unit 12, a second output level unit 13 and a cascade next element unit 14.

The detecting input unit 10 comprises a first delay 100 and a first inverter 101. The first delay unit 100 has an output terminal, and receives and delays an input signal. The first inverter 101 has an input terminal and an output terminal. The input terminal is connected to the first delay unit 100, which inverts the input signal.

The first output level unit 11 comprises a first NAND gate 110, a first diode 111 and a first resistor 112. The first NAND gate 110 has a first input terminal, a second input terminal and an output terminal. The first input terminal is connected to an alternate current source of an element. The second input terminal is connected to an output of the first inverter 101.

The first diode 111 has a positive terminal and a negative terminal. The negative terminal is connected to the output terminal of the first NAND gate 110. The first resistor 112 has a first terminal and a second terminal. The first terminal is connected to the positive terminal of the first diode 111.

The second delay unit 12 has an output terminal and is connected to the output terminal of the first inverter 101, which delays the input signal being inverted.

The second output level unit 13 comprises a second NAND gate 130 and a second diode 131. The second NAND gate 130 has a first input terminal, a second input terminal and an output terminal. The first input terminal is connected to the output terminal of the first delay unit 100. The second input terminal is connected to the output terminal of the second delay unit 12. The second diode 131 has a positive terminal and a negative terminal. The positive terminal is connected to the second terminal of the first resistor 112. The negative terminal is connected to the output terminal of the second NAND gate 130.

The cascade next element unit 14 comprises a second inverter 140 and a second resistor 141. The second inverter 140 has an input terminal and an output terminal. The input terminal is connected to the output terminal of the second delay unit 12. The second resistor 141 has a first terminal and a second terminal. The first terminal is connected to the output terminal of the second inverter 140. The second terminal is cascaded to an input terminal of a next element.

Figure 2:
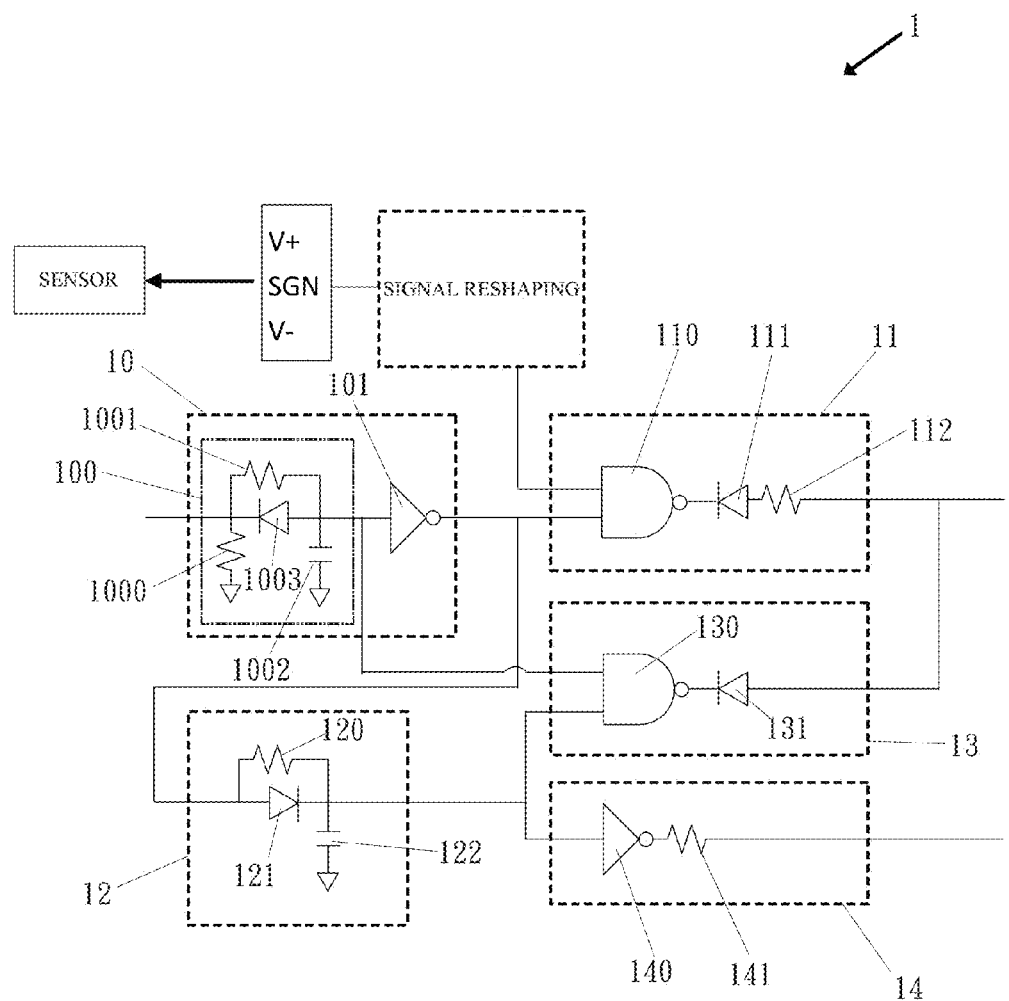
FIG. 2 is a detailed circuit diagram showing the alternating current detector with automatic judging of the amount of element under testing and monitoring of the present invention.

With reference to FIG. 2, in one embodiment of the present invention, the first delay unit 100 further comprises a third resistor 1000, a fourth resistor 1001, a first capacitor 1002 and a third diode 1003.

The third resistor 1000 has a first terminal and a second terminal. The first terminal is connected to ground. The second terminal receives the input signal. The fourth resistor 1001 has a first terminal and a second terminal. The first terminal is connected to the second terminal of the third resistor 1000.

The first capacitor 1002 has a first terminal and a second terminal. The first terminal is connected to the second terminal of the fourth resistor 1001. The second terminal is connected to ground.

The third diode 1003 has a positive terminal and a negative terminal. The positive terminal is connected to the second terminal of the fourth resistor 1001. The negative terminal is connected to the second terminal of the third resistor 1000 and receives the input signal.

In another embodiment of the present invention, the second delay unit 12 comprises a fifth resistor 120, a fourth diode 121 and a second capacitor 122.

The fifth resistor 120 has a first terminal and a second terminal, and the first terminal is connected to the output terminal of the first inverter 101.

The fourth diode 121 has a positive terminal and a negative terminal. The positive terminal is connected to the output terminal of the first inverter 101. The negative terminal is connected to the second terminal of the fifth resistor 120 and the second input terminal of the second NAND gate 130.

The second capacitor 122 has a first terminal and a second terminal, the first terminal is connected to the negative terminal of the fourth diode 121, the second terminal is connected to ground.

In one embodiment of the present invention, the first input terminal of the first NAND gate 110 is connected to an alternating current source of an element via connecting to an external transducer, a switch or a button.

Figure 3:
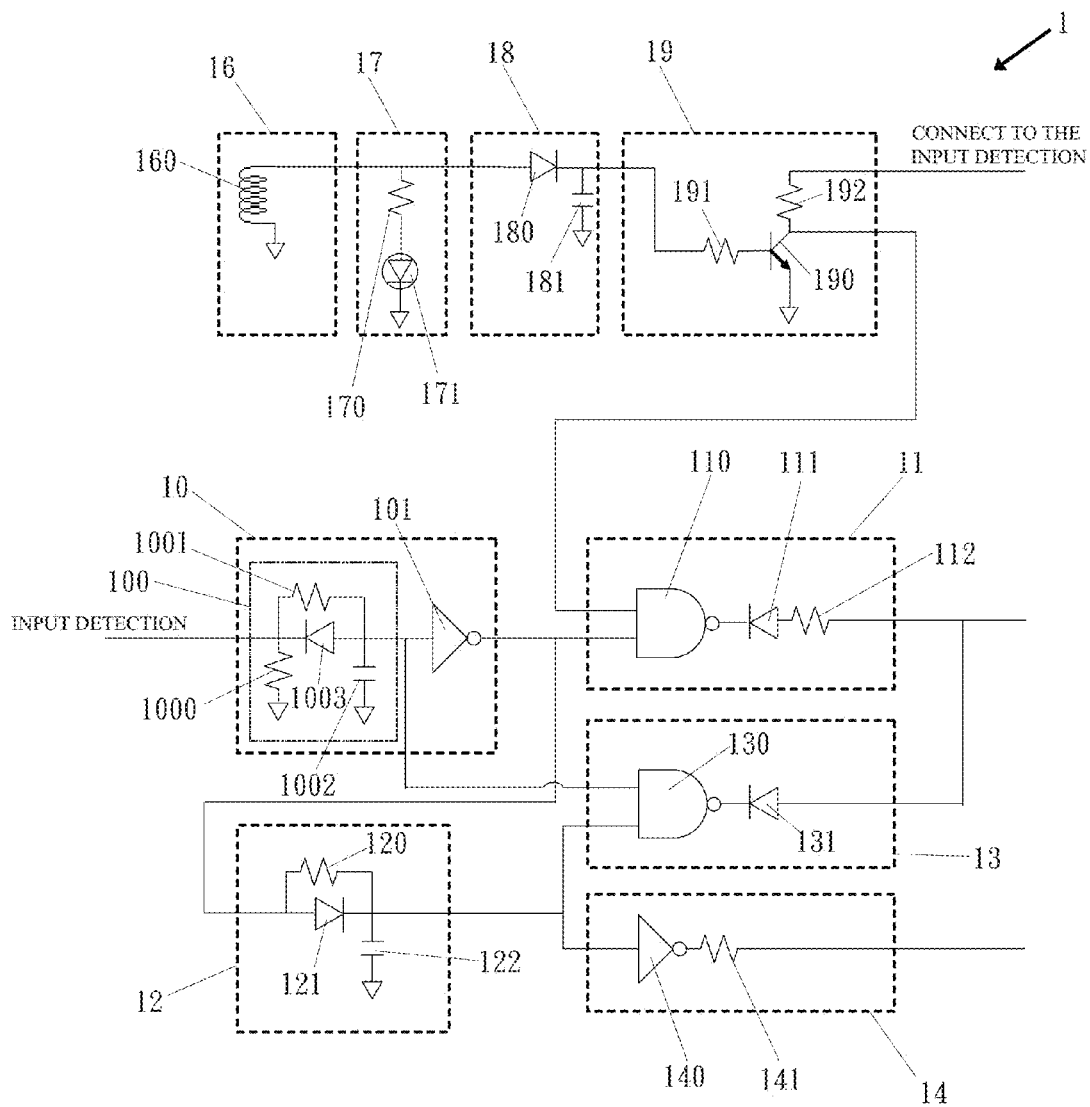
FIG. 3 is a drawing illustrating an embodiment of the alternating current detector with automatic judging of the amount of element under testing and monitoring of the present invention.
Figure 4:
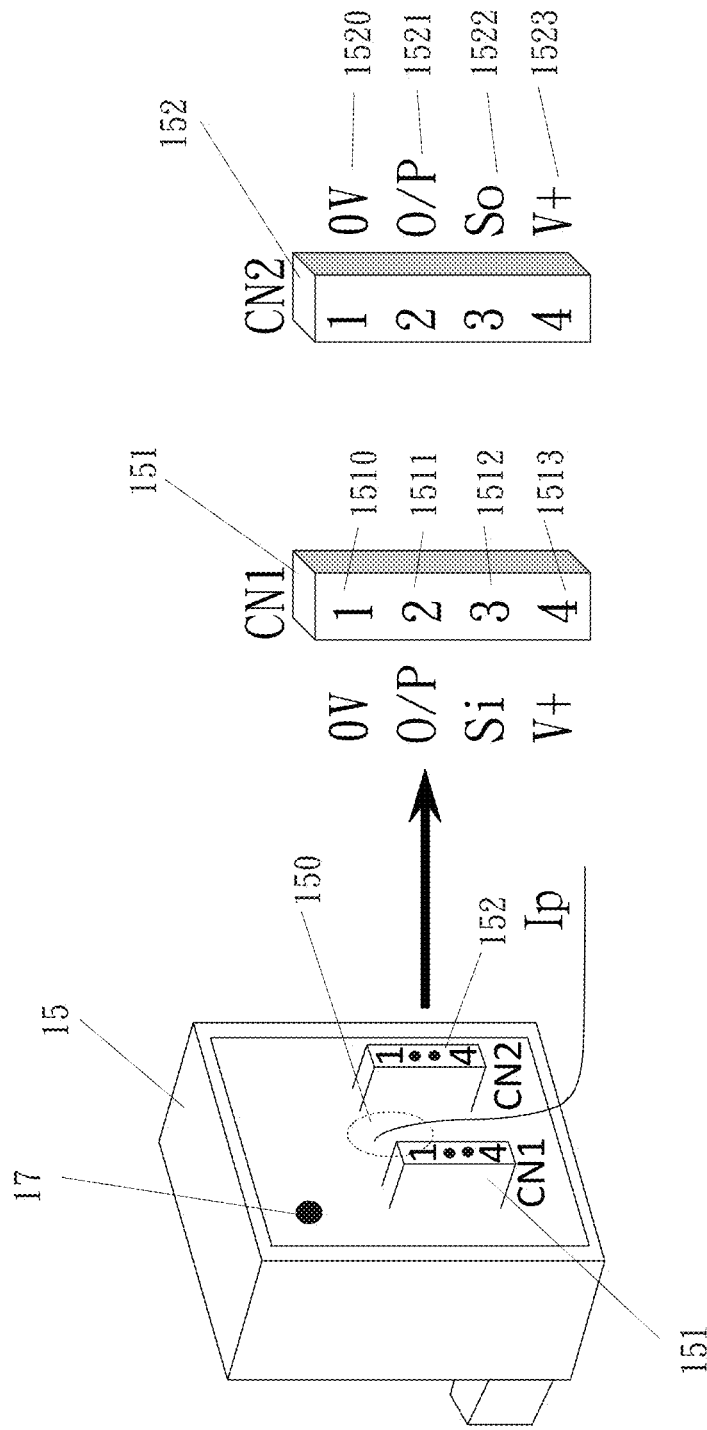
FIG. 4 is a drawing illustrating an embodiment of a case of the alternating current detector with automatic judging of the amount of element under testing and monitoring of the present invention.

With reference to FIGS. 3 and 4, in one embodiment of the present invention, the alternating current detector with automatic judging of the amount of element under testing and monitoring 1 further comprises a case 15, a magnetic field induced circuit 16, an indicating lamp 17, a rectifier and filter circuit 18 and an amplifier and driver circuit 19.

The case 15 comprises a perforation 150, and a first output terminal and a second output terminal. The perforation 150 is passed through by an electric wire with a alternate current source.

The magnetic field induced circuit 16 is located in the inside of the case 15 and around the perforation 150, which senses a magnetic field that is induced from the alternate current source of the electric wire to induce a first voltage.

The indicating lamp 17 is coupled to the magnetic field induced circuit 16 and lights according to the first voltage.

The rectifier and filter circuit 18 rectifies and filters the first voltage to induce a second voltage.

The amplifier and driver circuit 19 amplifies the second voltage to induce an output current between the first output terminal and the second output terminal.

In one embodiment, the magnetic field induced circuit 16 comprises a solenoid 160 which detects a magnetic field generated by an alternating current on a wire through the perforation 150.

In one embodiment, the indicating lamp 17 comprises a sixth resistor 170 and an LED indicating lamp 171.

In one embodiment, the rectifier and filter circuit 18 comprises a fifth diode 180 and a third capacitor 181.

The amplifier and driver circuit 19 comprises a first transistor 190, a seventh resistor 191 and an eighth resistor 192. The first transistor comprises a collector which is coupled to the first output terminal. The first transistor 190 comprises a base, a collector and an emitter. The collector of the first transistor 190 is coupled to the first output terminal. The emitter of the first transistor 190 is coupled to the second output terminal.

Figure 5:
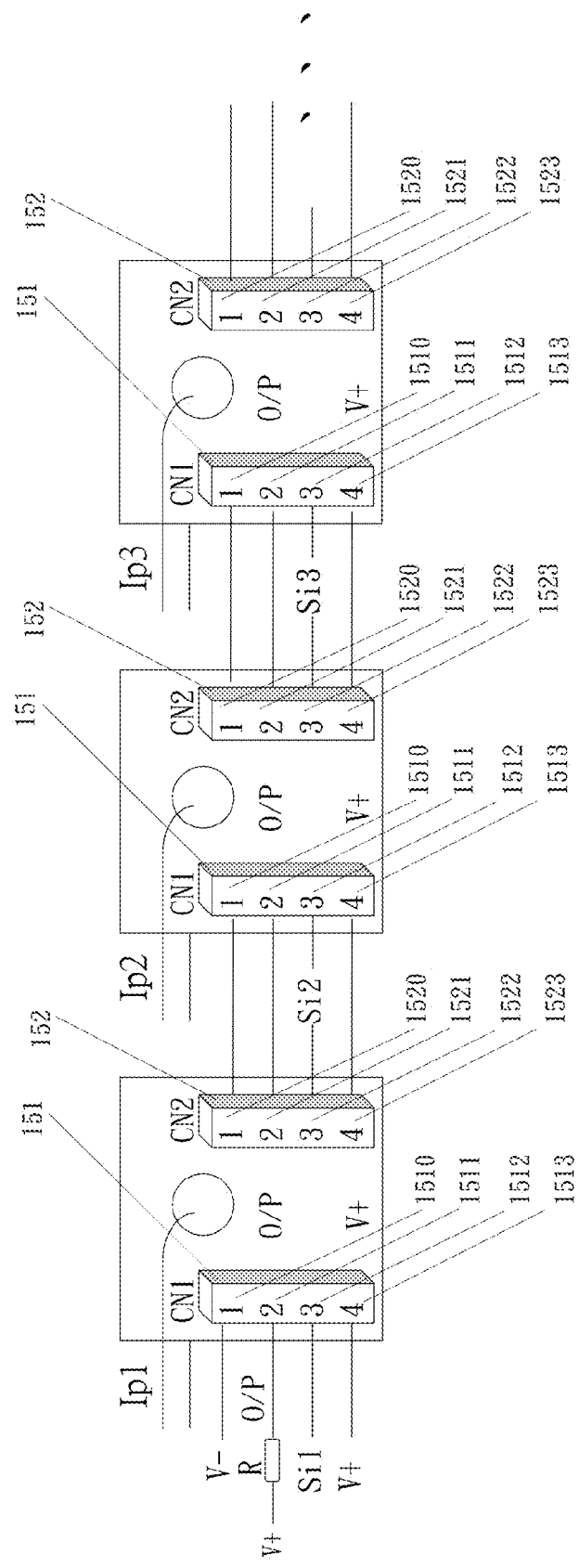
FIG. 5 is a perspective view showing the alternating current detector with automatic judging of the amount of element under testing and monitoring of the present invention which is connected to multiple alternating current detectors.

With reference to FIG. 5, in one embodiment of the present invention, the case 15 further comprises an input terminal set 151 and an output terminal set 152.

The input terminal set 151 comprises an input power source negative terminal 1510, an input terminal 1511, an input signal terminal 1512 and an input power source positive terminal 1513.

The output terminal set 152 comprises an output power source negative terminal 1520, an output terminal 1521, an output signal terminal 1522 and an output power source positive terminal 1523.

The output power source negative terminal 1520 is connected to the input power source negative terminal 1510 of the next alternating current detector with automatic judging of the amount of element under testing and monitoring 1.

The output terminal 1521 is cascaded to the input terminal 1511 of the next alternating current detector with automatic judging of the amount of element under testing and monitoring 1.

The output signal terminal 1522 is cascaded to the input signal terminal 1512 of the next alternating current detector with automatic judging of the amount of element under testing and monitoring 1.

The output power source positive terminal 1523 is connected to the input power source positive terminal 1513 of the next alternating current detector with automatic judging of the amount of element under testing and monitoring 1.

Figure 6:
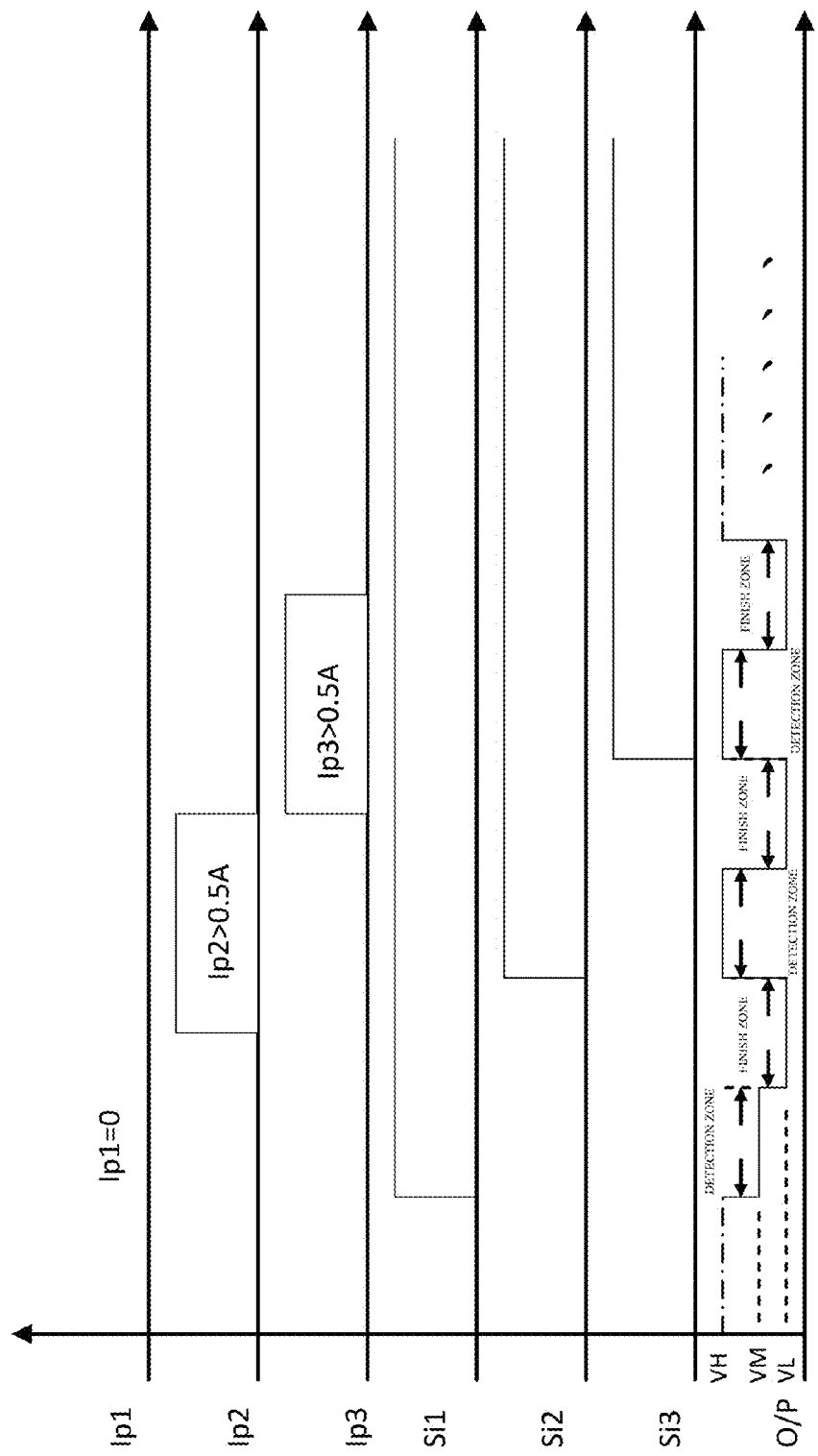
FIG. 6 is a timing diagram showing the alternating current detector with automatic judging of the amount of element under testing and monitoring of the present invention.

With reference to FIG. 6, the output terminal of the present invention comprises high direct current output voltage level (VH), middle direct current output voltage level (VM) and low direct current output voltage level (VL).

The detection process of the present invention comprises a detection zone and a finish zone.

When the input terminal voltage level changes from low to high, the detection zone starts to read the direct current output voltage level from the output terminal of the present invention. If the output terminal of the present invention is high direct current output voltage level (VH), it represents Load ON. If the output terminal of the present invention is middle direct current output voltage level (VM), it represents Load OFF.

Then the finish zone reads the direct current output voltage level from the output terminal of the present invention. If the output terminal of the present invention is low direct current output voltage level (VL), it represents the element under test and monitoring is finished testing and outputs a start test signal to the next element, and so forth. If the output terminal of the present invention is high direct current output voltage level (VH) and remains so for a long time, it represents there is no next element under test and monitoring.

The alternating current detector with automatic judging of the amount of element under testing and monitoring of the present invention directly detects the magnetic field which is generated by the alternating current in a noninvasive manner, which is not influenced and interfered by the electrical characteristics of the detected electric appliances. Moreover, the present invention transforms a weak alternating current signal into a digital ON/OFF electronic signal, which is used in long distance detection, is not interfered with and is durable.

The present invention automatically judges the amount of element under testing and monitoring, which uses a cascading method and measures one element and then informs the next element without fundamental error and accumulative error of the element.

The present invention identifies the element under testing and monitoring according the cascading position, which is used directly without setting any parameters. The present invention uses output terminal parallel connections which dramatically reduces wiring.

While the invention has been described in connection with what is considered the most practical and preferred embodiments, it is understood that this invention is not limited to the disclosed embodiment but is intended to cover various arrangements included within the spirit and scope of the broadest interpretation so as to encompass all such modifications and equivalent arrangements.

What is claimed is:

1. An alternating current detector with automatic judging of amount of element under testing and monitoring comprising:
   a detecting input unit comprising:
   a first delay unit having an output terminal for receiving and delaying an input signal; and a first inverter having an input terminal and an output terminal, the input terminal being connected to the first delay unit, which inverts the input signal;
a first output level unit comprising:
   a first NAND gate having a first input terminal, a second input terminal and an output terminal, the first input terminal being connected to an alternating current source of an element, the second input terminal being connected to an output of the first inverter;
   a first diode having a positive terminal and a negative terminal, the negative terminal being connected to the output terminal of the first NAND gate;
   a first resistor having a first terminal and a second terminal, the first terminal being connected to the positive terminal of the first diode;
a second delay unit having an output terminal and being connected to the output terminal of the first inverter, which delays the input signal being inverted;
a second output level unit comprising:
   a second NAND gate having a first input terminal, a second input terminal and an output terminal, the first input terminal being connected to the output terminal of the first delay unit, the second input terminal being connected to the output terminal of the second delay unit; and
   a second diode having a positive terminal and a negative terminal, the positive terminal being connected to the second terminal of the first resistor, the negative terminal being connected to the output terminal of the second NAND gate; and
a cascade next element unit comprising:
   a second inverter having an input terminal and an output terminal, the input terminal being connected to the output terminal of the second delay unit; and
   a second resistor having a first terminal and a second terminal, the first terminal being connected to the output terminal of the second inverter, the second terminal being cascaded to an input terminal of a next element.

2. The alternating current detector with automatic judging of amount of element under testing and monitoring as claimed in claim 1, wherein the first delay unit further comprises:
   a third resistor having a first terminal and a second terminal, the first terminal is connected to the ground, the second terminal receives the input signal;
   a fourth resistor having a first terminal and a second terminal, the first terminal is connected to the second terminal of the third resistor;
   a first capacitor having a first terminal and a second terminal, the first terminal is connected to the second terminal of the fourth resistor, the second terminal is connected to ground; and
   a third diode having a positive terminal and a negative terminal, the positive terminal is connected to the second terminal of the fourth resistor, the negative terminal is connected to the second terminal of the third resistor and receives the input signal.

3. The alternating current detector with automatic judging of amount of element under testing and monitoring as claimed in claim 1, wherein the second delay unit comprises:
   a fifth resistor having a first terminal and a second terminal, the first terminal is connected to the output terminal of the first inverter;
   a fourth diode having a positive terminal and a negative terminal, the positive terminal is connected to the output terminal of the first inverter, the negative terminal is connected to the second terminal of the fifth resistor and the second input terminal of the second NAND gate; and
   a second capacitor having a first terminal and a second terminal, the first terminal is connected to the negative terminal of the fourth diode, the second terminal is connected to ground.

4. The alternating current detector with automatic judging of amount of element under testing and monitoring as claimed in claim 2, wherein the second delay unit comprises:
   a fifth resistor having a first terminal and a second terminal, the first terminal is connected to the output terminal of the first inverter;
   a fourth diode having a positive terminal and a negative terminal, the positive terminal is connected to the output terminal of the first inverter, the negative terminal is connected to the second terminal of the fifth resistor and the second input terminal of the second NAND gate; and
   a second capacitor having a first terminal and a second terminal, the first terminal is connected to the negative terminal of the fourth diode, the second terminal is connected to ground.

5. The alternating current detector with automatic judging of amount of element under testing and monitoring as claimed in claim 1, wherein the first input terminal of the first NAND gate is connected to an alternating current source of an element through connecting to an external transducer, a switch or a button.

6. The alternating current detector with automatic judging of amount of element under testing and monitoring as claimed in claim 2, wherein the first input terminal of the first NAND gate is connected to an alternating current source of an element through connecting to an external transducer, a switch or a button.

7. The alternating current detector with automatic judging of amount of element under testing and monitoring as claimed in claim 3, wherein the first input terminal of the first NAND gate is connected to an alternating current source of an element through connecting to an external transducer, a switch or a button.

8. The alternating current detector with automatic judging of amount of element under testing and monitoring as claimed in claim 4, wherein the first input terminal of the first NAND gate is connected to an alternating current source of an element through connecting to an external transducer, a switch or a button.

9. The alternating current detector with automatic judging of amount of element under testing and monitoring as claimed in claim 1, further comprising:
   a case comprising a perforation, a first output terminal and a second output terminal, the perforation is passed through by an electric wire with an alternating current source;
   a magnetic field induced circuit located in the inside of the case and around the perforation, which senses a magnetic field that is induced from the alternating current source of the electric wire to induce a first voltage;
   an indicating lamp coupled to the magnetic field induced circuit and lights according to the first voltage;
   a rectifier and filter circuit which rectifies and filters the first voltage to induce a second voltage; and
   an amplifier and driver circuit which amplifies the second voltage to induce an output current between the first output terminal and the second output terminal.

10. The alternating current detector with automatic judging of amount of element under testing and monitoring as claimed in claim 2, further comprising:
- a case comprising a perforation, a first output terminal and a second output terminal, the perforation is passed through by an electric wire with an alternating current source;
- a magnetic field induced circuit located in the inside of the case and around the perforation, which senses a magnetic field that is induced from the alternating current source of the electric wire to induce a first voltage;
- an indicating lamp coupled to the magnetic field induced circuit and lights according to the first voltage;
- a rectifier and filter circuit which rectifies and filters the first voltage to induce a second voltage; and
- an amplifier and driver circuit which amplifies the second voltage to induce an output current between the first output terminal and the second output terminal.

11. The alternating current detector with automatic judging of amount of element under testing and monitoring as claimed in claim 9, wherein the case further comprises:
- an input terminal set comprising:
- an input power source negative terminal;
- an input terminal;
- an input signal terminal; and
- an input power source positive terminal; and
- an output terminal set comprising;
- an output power source negative terminal connected to the input power source negative terminal of the next alternating current detector with automatic judging of amount of element under testing and monitoring;
- an output terminal cascaded to the input terminal of the next alternating current detector with automatic judging of amount of element under testing and monitoring;
- an output signal terminal cascaded to the input signal terminal of the next alternating current detector with automatic judging of amount of element under testing and monitoring; and
- an output power source positive terminal connected to the input power source positive terminal of the next alternating current detector with automatic judging of amount of element under testing and monitoring.

12. The alternating current detector with automatic judging of amount of element under testing and monitoring as claimed in claim 10, wherein the case further comprises:
- an input terminal set comprising:
- an input power source negative terminal;
- an input terminal;
- an input signal terminal; and
- an input power source positive terminal; and
- an output terminal set comprising;
- an output power source negative terminal connected to the input power source negative terminal of the next alternating current detector with automatic judging of amount of element under testing and monitoring;
- an output terminal cascaded to the input terminal of the next alternating current detector with automatic judging of amount of element under testing and monitoring;
- an output signal terminal cascaded to the input signal terminal of the next alternating current detector with automatic judging of amount of element under testing and monitoring; and
- an output power source positive terminal connected to the input power source positive terminal of the next alternating current detector with automatic judging of amount of element under testing and monitoring.

\* \* \* \* \*